US012804945B2

(12) United States Patent
Saitoh

(10) Patent No.: US 12,804,945 B2
(45) Date of Patent: Nov. 17, 2026

(54) SILICON CARBIDE SEMICONDUCTOR DEVICE AND METHOD FOR PRODUCING SILICON CARBIDE SEMICONDUCTOR DEVICE

(71) Applicant: SUMITOMO ELECTRIC INDUSTRIES, LTD., Osaka (JP)

(72) Inventor: Yu Saitoh, Osaka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 357 days.

(21) Appl. No.: 18/579,668

(22) PCT Filed: Aug. 3, 2022

(86) PCT No.: PCT/JP2022/029771

§ 371 (c)(1),
(2) Date: Jan. 16, 2024

(87) PCT Pub. No.: WO2023/026803

PCT Pub. Date: Mar. 2, 2023

(65) Prior Publication Data

US 2024/0332414 A1 Oct. 3, 2024

(30) Foreign Application Priority Data

Aug. 25, 2021 (JP) ................................ 2021-137290

(51) Int. Cl.
*H10D 30/66* (2025.01)
*H10D 12/01* (2025.01)
(Continued)

(52) U.S. Cl.
CPC ......... *H10D 30/665* (2025.01); *H10D 12/031* (2025.01); *H10D 62/8325* (2025.01);
(Continued)

(58) Field of Classification Search
CPC ........................... H10D 30/665; H10D 64/516
See application file for complete search history.

(56) References Cited

U.S. PATENT DOCUMENTS 10,109,725 B2 * 10/2018 Storasta ............... H10D 12/441
2002/0185680 A1 * 12/2002 Henninger ........... H10D 30/668 257/330
(Continued)

FOREIGN PATENT DOCUMENTS

CN 105702734 6/2016
DE 112009005538 2/2020
(Continued)

OTHER PUBLICATIONS

Office Action mailed on Mar. 19, 2026 with respect to the corresponding Chinese patent application No. 202280050942.3.
(Continued)

*Primary Examiner* — Evren Seven
(74) *Attorney, Agent, or Firm* — IPUSA, PLLC

(57) ABSTRACT

Silicon carbide semiconductor device includes silicon-carbide-substrate including first-main-surface and second-main-surface opposite to the first-main-surface; and insulating layer in contact with the first-main-surface. In plan-view from direction perpendicular to the first-main-surface, the silicon-carbide-substrate includes active region and termination region enclosing the active region. Opening where part of the active region is exposed is formed in the insulating layer. The silicon carbide semiconductor device further includes electrode formed on the insulating layer and in contact with the first-main-surface through the opening. The insulating layer includes first-portion overlapping the termination region and having first-thickness, in the plan-view; second-portion connecting to the first-portion, overlapping the electrode, and having second-thickness, in the plan-view; and third-portion connecting to the second-por-
(Continued)

tion, overlapping the electrode, and having third-thickness, in the plan-view. The opening is formed in the third-portion. The second-portion is between the first-portion and the third-portion. The second-thickness is larger than the first and third thicknesses.

11 Claims, 16 Drawing Sheets

(51) Int. Cl.
*H10D 62/832* (2025.01)
*H10D 64/27* (2025.01)
*H10W 74/10* (2026.01)
*H10W 74/43* (2026.01)

(52) U.S. Cl.
CPC ........ *H10D 64/514* (2025.01); *H10W 74/137* (2026.01); *H10W 74/43* (2026.01)

(56) References Cited

U.S. PATENT DOCUMENTS

2003/0067033 A1 4/2003 Kinoshita et al.
2004/0173820 A1* 9/2004 Kinoshita ............ H10D 30/665 257/E29.104
2012/0256195 A1 10/2012 Aketa
2014/0264583 A1* 9/2014 Yamaji ................. H10D 64/117 257/339
2014/0291697 A1 10/2014 Rupp et al.
2015/0115286 A1 4/2015 Takeuchi et al.
2016/0172474 A1 6/2016 Miyake et al.
2016/0254392 A1 9/2016 Hasegawa et al.
2017/0301788 A1* 10/2017 Fukui .................. H10D 30/665
2020/0127098 A1 4/2020 Yamashiro et al.
2023/0197786 A1* 6/2023 Mori .................... H10D 62/155 257/77

FOREIGN PATENT DOCUMENTS

JP 2003-101039 4/2003
JP 2012-227501 11/2012
JP 2014-017469 1/2014
JP 2014-207444 10/2014
JP 2016-162785 9/2016
WO 2018/084020 5/2018

OTHER PUBLICATIONS

Office Action mailed on May 19, 2026 with respect to the corresponding Japanese patent application No. 2023-543780.

* cited by examiner

SILICON CARBIDE SEMICONDUCTOR DEVICE AND METHOD FOR PRODUCING SILICON CARBIDE SEMICONDUCTOR DEVICE

TECHNICAL FIELD

The present disclosure relates to silicon carbide semiconductor devices, and production methods of silicon carbide semiconductor devices.

The present application claims priority to Japanese Patent Application No. 2021-137290, filed on Aug. 25, 2021, and the contents of the above Japanese patent application are incorporated herein by reference in their entirety.

BACKGROUND ART

Silicon carbide semiconductor devices in which a recessed portion is formed in a termination region of a silicon carbide substrate and then a source electrode is formed, are disclosed (see, for example, Patent Literature 1).

CITATION LIST

Patent Literature

Patent Literature 1: Japanese Laid-Open Patent Publication No. 2014-17469

SUMMARY OF INVENTION

A silicon carbide semiconductor device of the present disclosure includes: a silicon carbide substrate including a first main surface and a second main surface opposite to the first main surface; and an insulating layer in contact with the first main surface. In a plan view from a direction perpendicular to the first main surface, the silicon carbide substrate includes an active region and a termination region that encloses the active region. An opening in which a part of the active region is exposed is formed in the insulating layer. The silicon carbide semiconductor device further includes an electrode that is formed on the insulating layer and is in contact with the first main surface through the opening. The insulating layer includes: a first portion overlapping the termination region in the plan view and having a first thickness; a second portion connecting to the first portion, overlapping the electrode in the plan view, and having a second thickness; and a third portion connecting to the second portion, overlapping the electrode in the plan view, and having a third thickness. The opening is formed in the third portion. The second portion is between the first portion and the third portion. The second thickness is larger than the first thickness and the third thickness.

DESCRIPTION OF EMBODIMENTS

Figure 1:
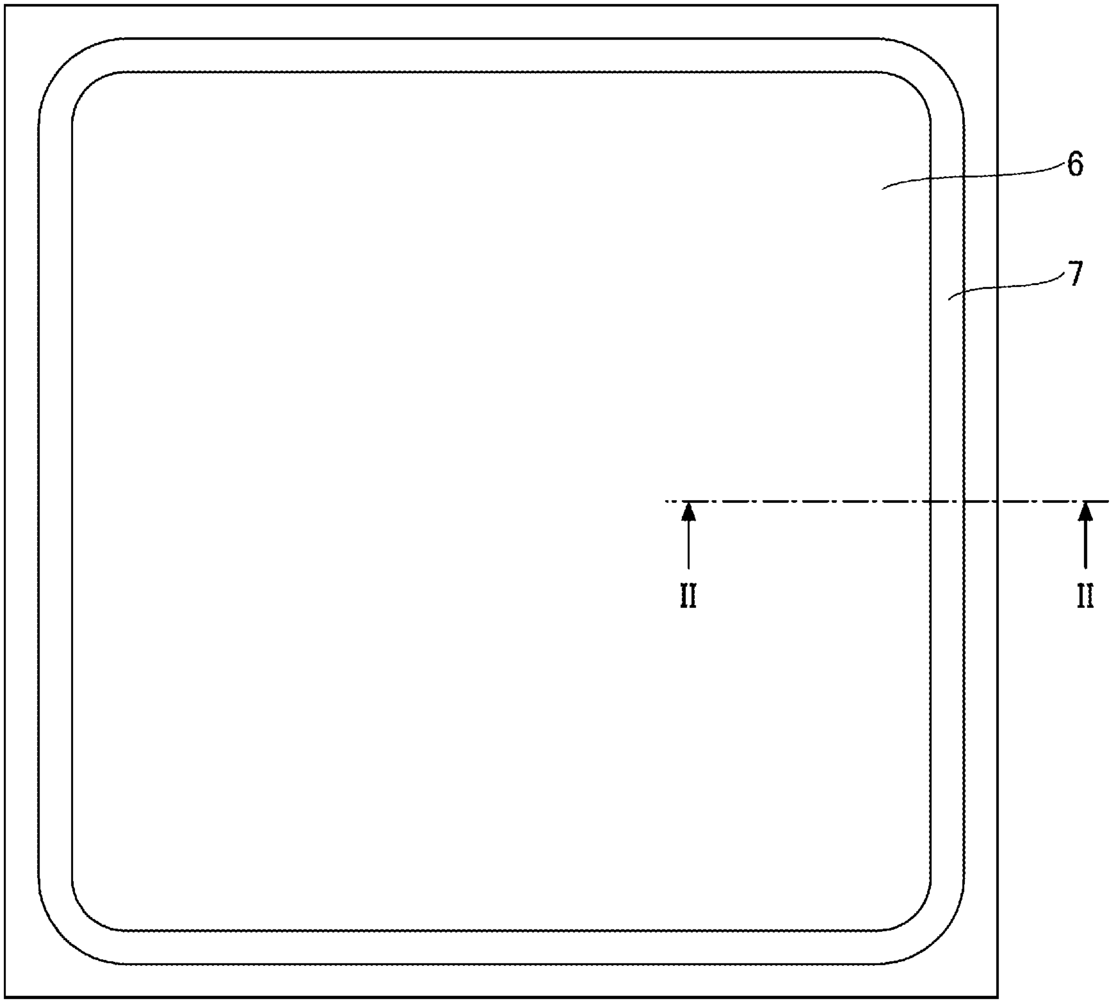
FIG. 1 is a view illustrating a layout of a silicon carbide semiconductor device according to an embodiment.

Objects to be Solved by the Present Disclosure

In the silicon carbide semiconductor device described in Patent Literature 1, electric field concentration tends to occur in the insulating layer in the termination region. Such electric field concentration can lead to breakage.

It is an object of the present disclosure to provide: a silicon carbide semiconductor device in which electric field concentration of an insulating layer in a termination region can be relaxed; and a production method of the silicon carbide semiconductor device.

Effects of the Present Disclosure

According to the present disclosure, it is possible to relax electric field concentration of an insulating layer in a termination region.

Embodiments will be described below.

Description of Embodiments of the Present Disclosure

First, embodiments of the present disclosure will be listed and described. In the following description, the same or corresponding elements are provided with the same symbols, and the same description thereof is not repeated. For crystallographic description in the present specification, an individual orientation is indicated by [ ], a group orientation is indicated by < >, an individual plane is indicated by ( ) and a group plane is indicated by { }. Also, a negative index in crystallography is usually expressed by placing "-" (bar) over the number. In the present specification, however, a minus sign is placed in front of the number.

[1] A silicon carbide semiconductor device according to one aspect of the present disclosure includes: a silicon carbide substrate including a first main surface and a second main surface opposite to the first main surface; and an insulating layer in contact with the first main surface, in which in a plan view from a direction perpendicular to the first main surface, the silicon carbide substrate includes an active region and a termination region that encloses the active region, an opening in which a part of the active region is exposed is formed in the insulating layer, the silicon carbide semiconductor device further includes an electrode that is formed on the insulating layer and is in contact with the first main surface through the opening, the insulating layer includes: a first portion overlapping the termination region in the plan view and having a first thickness; a second portion connecting to the first portion, overlapping the electrode in the plan view, and having a second thickness; and a third portion connecting to the second portion, overlapping the electrode in the plan view, and having a third thickness, the opening is formed in the third portion, the second portion is between the first portion and the third portion, and the second thickness is larger than the first thickness and the third thickness.

Because the second thickness of the second portion is larger than the first thickness of the first portion, it is possible to suppress generation of metal residues upon etching a metal film for forming the electrode. Therefore, it is possible to relax electric field concentration of the insulating layer originating from the metal residues in the termination region. Also, because the second thickness of the second portion is larger than the third thickness of the third portion, thickening of the insulating layer in the active region is suppressed, and the opening is readily embedded with the electrode.

[2] In [1], the insulating layer includes: an upper surface of the first portion that is parallel to the first main surface; a side surface of the second portion that is exposed toward the first portion and is perpendicular to the first main surface; and a curved surface connecting the upper surface and the side surface to each other, and the curved surface may have a curvature that is convex with respect to a direction toward the insulating layer. In this case, compared to the case in which the upper surface and the side surface directly connect to each other, stress concentration in the insulating layer is readily suppressed. Moreover, stress concentration in a passivation film formed on the insulating layer is also readily suppressed.

[3] In [2], $0.1 \leq r/T1 \leq 0.5$ may be established, where r denotes a radius of an imaginary circle including the curved surface in a cross section perpendicular to the first main surface, and T1 denotes the first thickness. In this case, both of relaxation of stress concentration and relaxation of electric field concentration in the termination region can be readily achieved.

[4] In any one of [1] to [3], the first thickness may be larger than the third thickness. In this case, while relaxing electric field concentration in the termination region, the opening is readily embedded with the electrode.

[5] In any one of [1] to [3], the third thickness may be larger than the first thickness. When electric field concentration does not tend to occur in the first portion in accordance with applications and the like, the first thickness may be smaller than the third thickness.

[6] In any one of [1] to [5], the electrode may overlap a part of the termination region in the plan view. In this case, the electrode is readily broadly ensured.

[7] In any one of [1] to [6], the insulating layer may include silicon oxide. In this case, film formation and processing are readily performed, and good insulating properties are readily obtained.

[8] In any one of [1] to [7], the first main surface in the active region and the first main surface in the termination region may be flush with each other. Because the insulating layer is appropriately formed, good characteristics are obtained even without forming a recessed portion in the silicon carbide substrate.

[9] In any one of [1] to [8], a passivation film that covers the insulating layer and the electrode may be included. In this case, the active region can be protected.

[10] In [9], the passivation film may include silicon nitride. When the curved surface is formed in the insulating layer, stress applied to the passivation film is readily relaxed even if the passivation film includes silicon nitride.

[11] A production method of a silicon carbide semiconductor device according to one aspect of the present disclosure includes:

- a step of forming an insulating layer in contact with a first main surface of a silicon carbide substrate including the first main surface and a second main surface opposite to the first main surface, where in a plan view from a direction perpendicular to the first main surface, the silicon carbide substrate includes an active region and a termination region that encloses the active region,
- the step of forming the insulating layer including:
  - a step of forming a field insulating film at the first main surface, the field insulating film overlapping the termination region in the plan view;
  - a step of forming a gate insulating film at the first main surface, the gate insulating film overlapping the termination region in the plan view and being thinner than the field insulating film;
  - a step of forming an interlayer insulating film covering the field insulating film and the gate insulating film;
  - a step of forming an opening in the interlayer insulating film and the gate insulating film, the opening exposing a part of the active region;
  - a step of forming a metal film on the interlayer insulating film, the metal film being in contact with the first main surface through the opening; and
  - a step of forming an electrode by etching the metal film while over-etching the interlayer insulating film.

Because the electrode is formed by etching the metal film while over-etching the interlayer insulating film, it is possible to suppress generation of metal residues upon etching the metal film. Therefore, it is possible to relax electric field concentration of the insulating layer originating from the metal residues in the termination region.

Embodiments of the Present Disclosure

Figure 2:
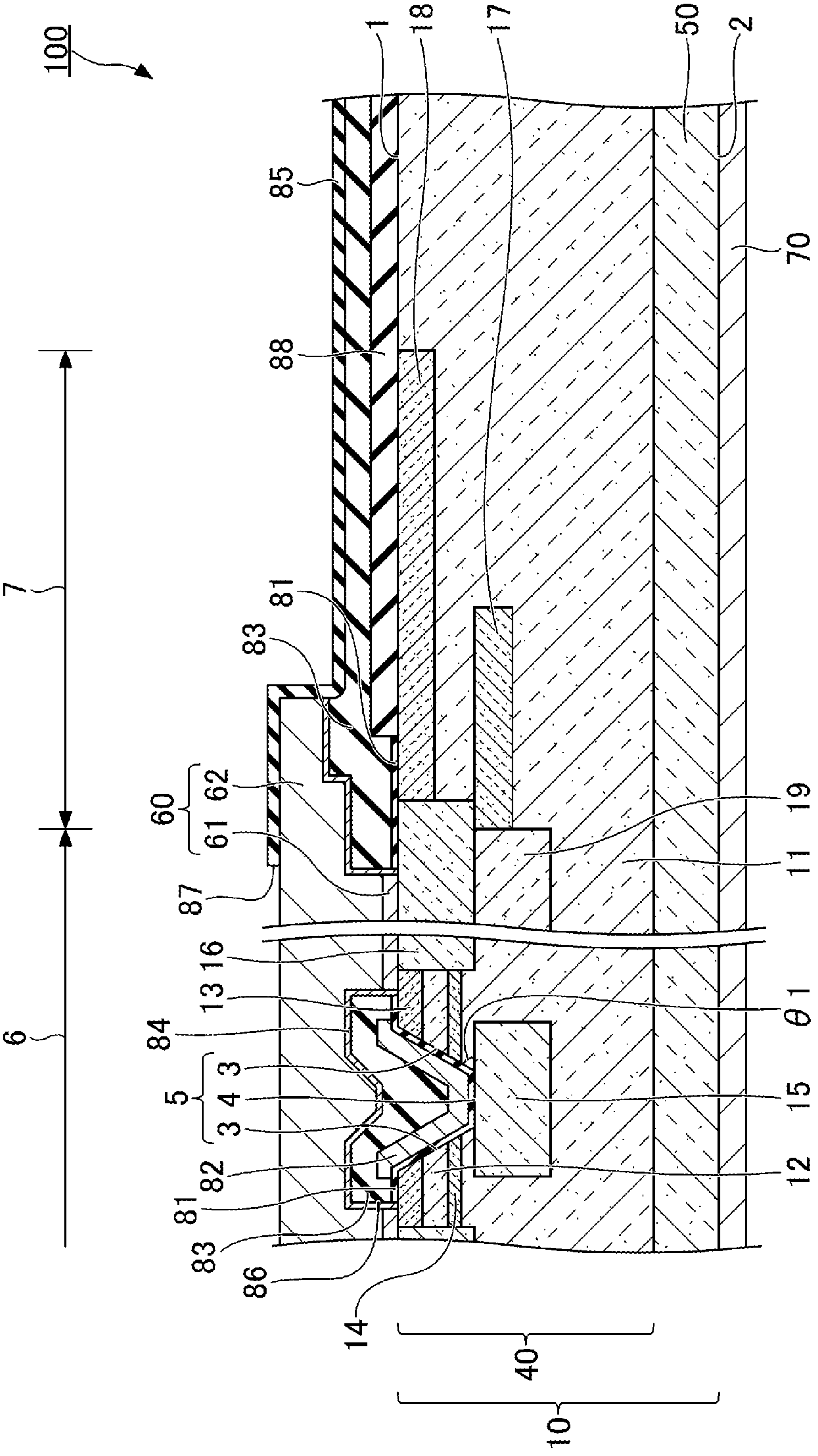
FIG. 2 is a cross-sectional view illustrating a configuration of the silicon carbide semiconductor device according to the embodiment.
Figure 3:
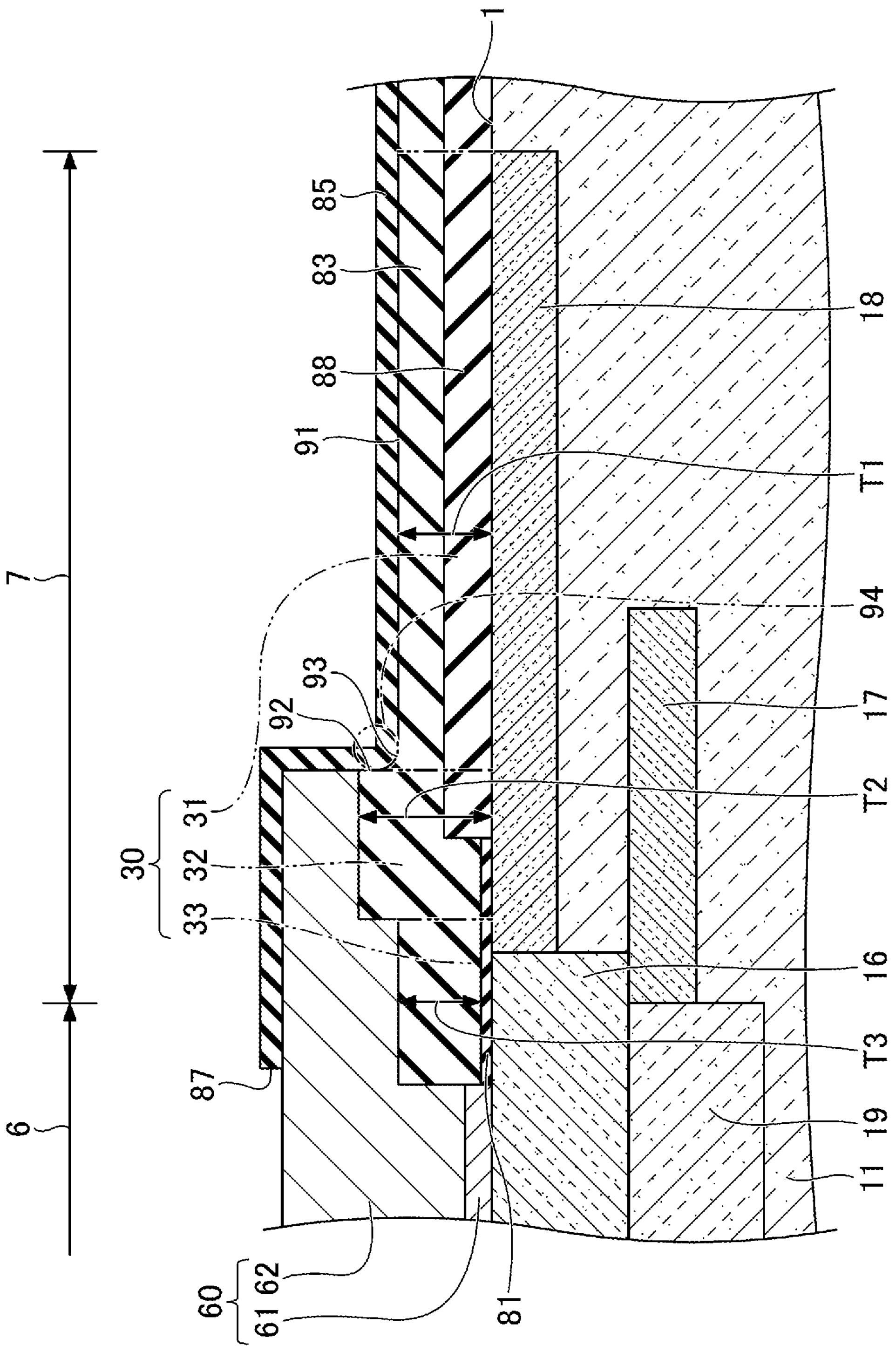
FIG. 3 is an enlarged cross-sectional view illustrating a part in FIG. 2.

An embodiment of the present disclosure relates to what is called a vertical-type MOSFET (silicon carbide semiconductor device). FIG. 1 is a view illustrating a layout of the silicon carbide semiconductor device according to the embodiment. FIG. 2 is a cross-sectional view illustrating a configuration of the silicon carbide semiconductor device according to the embodiment. FIG. 2 is a cross-sectional view taken along line II-II in FIG. 1. FIG. 3 is an enlarged cross-sectional view illustrating a part in FIG. 2.

As illustrated in FIG. 1 and FIG. 2, a MOSFET 100 according to the present embodiment mainly includes a silicon carbide substrate 10, an insulating layer 30, a gate electrode 82, a source electrode 60, a drain electrode 70, a barrier metal film 84, and a passivation film 85. The insulating layer 30 includes a gate insulating film 81, an interlayer insulating film 83, and a field insulating film 88. The silicon carbide substrate 10 includes a silicon carbide single-crystal substrate 50 and a silicon carbide epitaxial layer 40 on the silicon carbide single-crystal substrate 50. The silicon carbide substrate 10 includes a first main surface 1 and a second main surface 2 opposite to the first main surface 1. The silicon carbide epitaxial layer 40 forms the first main surface 1, and the silicon carbide single-crystal substrate 50 forms the second main surface 2. The silicon carbide single-crystal substrate 50 and the silicon carbide epitaxial layer 40 are formed of, for example, hexagonal silicon carbide of polytype 4H. For example, the silicon carbide single-crystal substrate 50 includes n-type impurities such as nitrogen (N) or the like and is of n-type conductivity (first conductive type).

The first main surface 1 is {0001} plane or a surface tilted from the {0001} plane in an off direction by an off angle of 8° or lower. Preferably, the first main surface 1 is (000-1) plane or a surface tilted from the (000-1) plane in an off direction by an off angle of 8° or lower. For example, the off direction may be <11-20> direction or may be <1-100> direction. For example, the off angle may be 1° or higher or may be 2° or higher. The off angle may be 6° or lower or may be 4° or lower.

In a plan view from a direction perpendicular to the first main surface 1, the MOSFET 100 includes an active region 6, and a termination region 7 provided around the active region 6.

The silicon carbide epitaxial layer 40 mainly includes a drift region 11, a body region 12, a source region 13, a current diffusion region 14, an electric field relaxation region 15, a shield region 19, a contact region 16, a buried junction termination extension (JTE) region 17, and a surface JTE region 18. The body region 12, the source region 13, the current diffusion region 14, the electric field relaxation region 15, the contact region 16, and the shield region 19 are provided in the active region 6. The buried JTE region 17 and the surface JTE region 18 are provided in the termination region 7. The drift region 11 is provided across the active region 6 and the termination region 7.

The drift region 11 is provided on the silicon carbide single-crystal substrate 50. The drift region 11 is at a position closer to the first main surface 1 than the silicon carbide single-crystal substrate 50. The drift region 11 may be continuous with the silicon carbide single-crystal substrate 50. For example, the drift region 11 includes n-type impurities such as nitrogen, phosphorus (P), or the like, and is of n-type conductivity.

The current diffusion region 14 is provided on the drift region 11. For example, the current diffusion region 14 includes n-type impurities such as phosphorus or the like, and is of n-type conductivity. The current diffusion region 14 is at a position closer to the first main surface 1 than the drift region 11. The drift region 11 is at a position closer to the second main surface 2 than the current diffusion region 14. The current diffusion region 14 is in contact with the drift region 11.

The body region 12 is provided on the current diffusion region 14. For example, the body region 12 includes p-type impurities such as aluminum (Al) or the like, and is of p-type conductivity (second conductive type). The body region 12 is at a position closer to the first main surface 1 than the current diffusion region 14. The current diffusion region 14 is at a position closer to the second main surface 2 than the body region 12. The body region 12 is in contact with the current diffusion region 14.

The source region 13 is provided on the body region 12. The source region 13 is separated by the body region 12 from the current diffusion region 14. For example, the source region 13 includes n-type impurities such as nitrogen, phosphorus, or the like, and is of n-type conductivity. The source region 13 is at a position closer to the first main surface 1 than the body region 12. The body region 12 is at a position closer to the second main surface 2 than the source region 13. The source region 13 is in contact with the body region 12. The source region 13 forms the first main surface 1. The source region 13 is covered with the gate insulating film 81. The source region 13 is in direct contact with the gate insulating film 81.

In a direction perpendicular to the second main surface 2, the current diffusion region 14 is between the body region 12 and the drift region 11. In the direction perpendicular to the second main surface 2, the body region 12 is between the source region 13 and the current diffusion region 14.

For example, the contact region 16 includes p-type impurities such as aluminum or the like, and is of p-type conductivity. The effective concentration of the p-type impurities in the contact region 16 is, for example, higher than the effective concentration of the p-type impurities in the body region 12. The contact region 16 penetrates the source region 13, the body region 12, and the current diffusion region 14. The contact region 16 is in contact with the body region 12. The contact region 16 forms the first main surface 1.

The first main surface 1 is provided with a gate trench 5 that is defined by a side surface 3 and a bottom surface 4. The side surface 3 penetrates the source region 13, the body region 12, the current diffusion region 14, and the drift region 11, and reaches the electric field relaxation region 15. The bottom surface 4 is continuous with the side surface 3. The source region 13, the body region 12, and the current diffusion region 14 are in contact with the side surface 3. The bottom surface 4 is positioned at the electric field relaxation region 15. The bottom surface 4 is, for example, a flat surface that is parallel to the second main surface 2. An angle $\theta 1$ of the side surface 3 with respect to a flat surface including the bottom surface 4 is, for example, 45° or higher and 65° or lower. The angle $\theta 1$ may be, for example, 50° or higher. The angle $\theta 1$ may be, for example, 60° or lower. The side surface 3 preferably has {0-33-8} plane. The {0-33-8} plane is a crystal plane in which excellent mobility can be obtained.

For example, the electric field relaxation region 15 includes p-type impurities such as aluminum or the like, and is of p-type conductivity. The electric field relaxation region 15 is between the current diffusion region 14 and the second main surface 2. In the plan view from the direction perpendicular to the first main surface 1, the electric field relaxation region 15 includes a portion overlapping the gate trench 5. For example, the electric field relaxation region 15 is between the bottom surface 4 of the gate trench 5 and the second main surface 2. For example, an upper end surface of the electric field relaxation region 15 includes, for example, the bottom surface 4 of the gate trench 5. A part of the upper end surface of the electric field relaxation region 15 faces a part of a lower end surface of the current diffusion region 14.

For example, the shield region 19 includes p-type impurities such as aluminum or the like, and is of p-type conductivity. In the plan view from the direction perpendicular to the first main surface 1, the shield region 19 is provided near the boundary of the active region 6 with the termination region 7, and has a shape of a circular flat plane. For example, the shield region 19 is formed at approximately the same depth as in the electric field relaxation region 15, with the first main surface 1 being a reference. The contact region 16 is also formed on the shield region 19. The upper end surface of the shield region 19 is in contact with the lower end surface of the contact region 16.

The buried JTE region 17 is in contact with the shield region 19 in a direction parallel to the first main surface 1. For example, the buried JTE region 17 includes p-type impurities such as aluminum or the like, and is of p-type conductivity. The buried JTE region 17 is apart from the first main surface 1 and the second main surface 2. An upper end surface of the buried JTE region 17 is in contact with a lower end surface of the contact region 16.

The surface JTE region 18 is in contact with the contact region 16 in the direction parallel to the first main surface 1. For example, the surface JTE region 18 includes p-type impurities such as aluminum or the like, and is of p-type conductivity. The surface JTE region 18 is provided above the buried JTE region 17. The surface JTE region 18 is apart from the buried JTE region 17. The surface JTE region 18 is at a position closer to the first main surface 1 than the buried JTE region 17. The buried JTE region 17 is at a position closer to the second main surface 2 than the surface JTE region 18. The surface JTE region 18 forms the first main surface 1. A part of the drift region 11 is between the surface JTE region 18 and the buried JTE region 17.

The field insulating film 88 is provided on the first main surface 1 in the termination region 7. The field insulating film 88 is, for example, an oxide film. The field insulating film 88 is formed of, for example, a material containing silicon dioxide.

The gate insulating film 81 is, for example, an oxide film. The gate insulating film 81 is formed of, for example, a material containing silicon dioxide. The gate insulating film 81 is in contact with the side surface 3 and the bottom surface 4. The gate insulating film 81 is in contact with the electric field relaxation region 15 in the bottom surface 4. The gate insulating film 81 is in contact with the source region 13, the body region 12, the current diffusion region 14, and the drift region 11 in the side surface 3. The gate insulating film 81 may be in contact with the source region 13, the contact region 16, and the surface JTE region 18 in the first main surface 1.

The gate electrode 82 is provided on the gate insulating film 81. The gate electrode 82 is formed of, for example, polysilicon (poly Si) containing conductive impurities. The gate electrode 82 is disposed in the interior of the gate trench 5. A part of the gate electrode 82 may be disposed on the first main surface 1.

The interlayer insulating film 83 is disposed in contact with the gate electrode 82 and the gate insulating film 81. The interlayer insulating film 83 is, for example, an oxide film. The interlayer insulating film 83 is formed of, for example, a material containing silicon dioxide. The interlayer insulating film 83 electrically insulates the gate electrode 82 and the source electrode 60 from each other. A part of the interlayer insulating film 83 may be provided in the interior of the gate trench 5.

A contact hole 86 is formed in the interlayer insulating film 83 and the gate insulating film 81. Through the contact hole 86, the source region 13 and the contact region 16 are exposed from the interlayer insulating film 83 and the gate insulating film 81. The contact hole 86 is one example of the opening.

The barrier metal film 84 covers the upper surface and the side surface of the interlayer insulating film 83, and the side surface of the gate insulating film 81. The barrier metal film 84 is in contact with the interlayer insulating film 83 and the gate insulating film 81. The barrier metal film 84 is formed of, for example, a material containing titanium nitride (TiN).

The source electrode 60 is in contact with the first main surface 1. The source electrode 60 includes a contact electrode 61 and a source pad electrode 62. In the first main surface 1, the contact electrode 61 may be in contact with the source region 13 and the contact region 16. The contact electrode 61 is formed of, for example, a material containing nickel silicide (Nisi). The contact electrode 61 may be formed of a material containing titanium, aluminum, and silicon. The contact electrode 61 is in Ohmic contact with the contact region 16. The source pad electrode 62 covers the upper surface and the side surface of the barrier metal film 84, and the upper surface of the contact electrode 61. The source pad electrode 62 is in contact with the barrier metal film 84 and the contact electrode 61. The source pad electrode 62 is formed of, for example, a material containing aluminum. The source electrode 60 is one example of the electrode.

As described above, the insulating layer 30 includes the gate insulating film 81, the interlayer insulating film 83, and the field insulating film 88. The contact hole 86 in which a part of the active region 6 is exposed is formed in the insulating layer 30. The insulating layer 30 includes a first portion 31, a second portion 32, and a third portion 33. The second portion 32 is between the first portion 31 and the third portion 33.

In the plan view from the direction perpendicular to the first main surface 1, the first portion 31 overlaps the termination region 7 and has a first thickness T1. The first portion 31 includes the field insulating film 88 and the interlayer insulating film 83. In the plan view from the direction perpendicular to the first main surface 1, the first portion 31 does not overlap the source electrode 60.

The second portion 32 is continuous with the first portion 31. In the plan view from the direction perpendicular to the first main surface 1, the second portion 32 overlaps the source electrode 60 and has a second thickness T2. The second portion 32 includes the gate insulating film 81, the field insulating film 88, and the interlayer insulating film 83. The thickness of the interlayer insulating film 83 in the second portion 32, i.e., the dimension thereof in the direction perpendicular to the first main surface 1, is larger than the thickness of the interlayer insulating film 83 in the first portion 31. The second thickness T2 is larger than the first thickness T1.

The third portion 33 is continuous with the second portion 32. In the plan view from the direction perpendicular to the first main surface 1, the third portion 33 overlaps the source electrode 60 and has a third thickness T3. The third portion 33 includes the gate insulating film 81 and the interlayer insulating film 83. The contact hole 86 is formed in the third portion 33. The second thickness T2 is larger than the third thickness T3.

The first thickness T1, the second thickness T2, and the third thickness T3 are thicknesses at portions whose upper surfaces are parallel to the first main surface 1 over 500 nm or longer, in a cross section perpendicular to the first main surface 1, e.g., in a cross section illustrated in FIG. 3.

For example, the insulating layer 30 includes an upper surface 91 of the first portion 31 parallel to the first main surface 1, a side surface 92 of the second portion 32 exposed toward the first portion 31 and perpendicular to the first main surface 1, and a curved surface 93 connecting the upper surface 91 and the side surface 92 to each other. The curved surface 93 has a curvature that is convex with respect to a direction toward the insulating layer 30.

The passivation film 85 covers the source pad electrode 62 and the interlayer insulating film 83. The passivation film 85 is in contact with the source pad electrode 62 and the interlayer insulating film 83. The passivation film 85 is formed of, for example, a material containing silicon nitride or polyimide. An opening 87 in which a part of the upper surface of the source pad electrode 62 is exposed is formed in the passivation film 85.

The drain electrode 70 is in contact with the second main surface 2. The drain electrode 70 is in contact with the silicon carbide single-crystal substrate 50 in the second main surface 2. The drain electrode 70 is electrically connected to the drift region 11. The drain electrode 70 is formed of, for example, a material containing nickel silicide. The drain electrode 70 may be formed of a material containing titanium, aluminum, and silicon. The drain electrode 70 is in Ohmic contact with the silicon carbide single-crystal substrate 50.

In the direction perpendicular to the second main surface 2, the upper end surface of the electric field relaxation region 15 may be apart from the bottom surface 4. In this case, for example, the bottom surface 4 may be positioned in the drift region 11, and the side surface 3 may penetrate the source region 13, the body region 12, the current diffusion region 14, and reach the drift region 11. For example, a part of the drift region 11 may be between the upper end surface of the electric field relaxation region 15 and the bottom surface 4.

A buffer layer may be provided between the silicon carbide single-crystal substrate 50 and the drift region 11. For example, the buffer layer includes n-type impurities such as nitrogen or the like and is of n-type conductivity.

Next, a production method of the MOSFET 100 according to the embodiment will be described. FIG. 4 to FIG. 16 are cross-sectional views illustrating the production method of the MOSFET 100 according to the embodiment. Similar to FIG. 2, FIG. 4 to FIG. 16 are cross-sectional views taken along the line II-II in FIG. 1.

Figure 4:
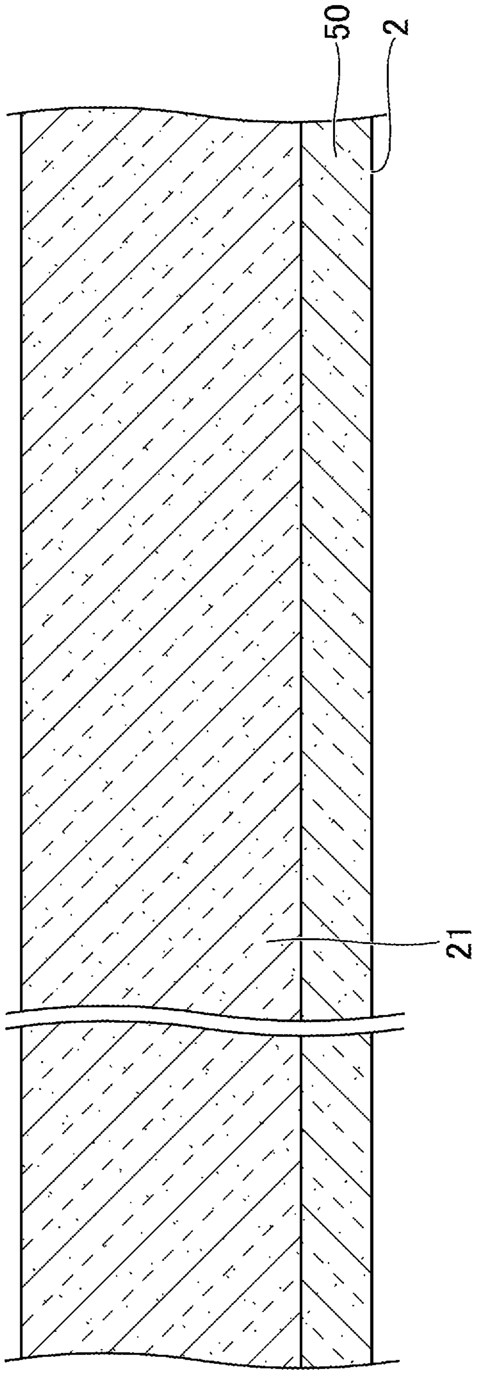
FIG. 4 is a cross-sectional view illustrating a production method of the silicon carbide semiconductor device according to the embodiment (part 1).

First, as illustrated in FIG. 4, the silicon carbide single-crystal substrate 50 is provided. For example, the silicon carbide single-crystal substrate 50 is provided by slicing a silicon carbide ingot (not illustrated) produced by a sublimation method. A buffer layer (not illustrated) may be formed on the silicon carbide single-crystal substrate 50. The buffer layer can be formed through chemical vapor deposition (CVD) using, for example, a gas mixture of silane ($SiH_4$) and propane ($C_3H_8$) as a raw material gas and using, for example, hydrogen ($H_2$) as a carrier gas. Upon epitaxial growth of the buffer layer, n-type impurities such as nitrogen or the like may be introduced to the buffer layer.

Next, as illustrated in FIG. 4, an epitaxial layer 21 is formed. Through CVD using, for example, a gas mixture of silane and propane as a raw material gas and using, for example, hydrogen as a carrier gas, the epitaxial layer 21 is formed on the silicon carbide single-crystal substrate 50. Upon epitaxial growth, n-type impurities such as nitrogen or the like are introduced to the epitaxial layer 21. The epitaxial layer 21 is of n-type conductivity.

Figure 5:
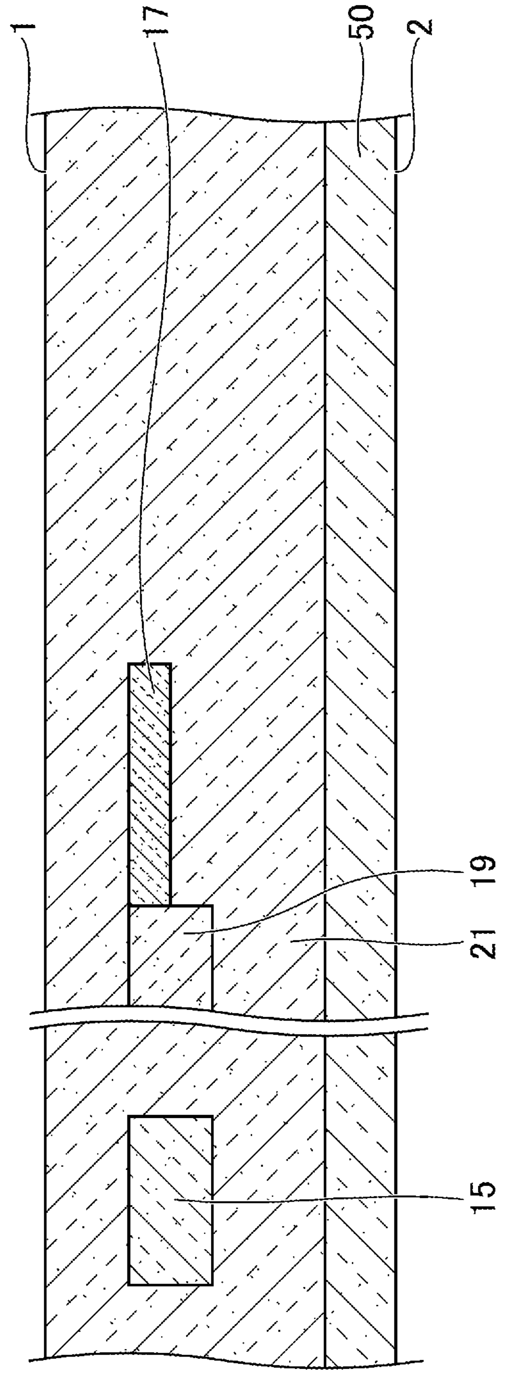
FIG. 5 is a cross-sectional view illustrating the production method of the silicon carbide semiconductor device according to the embodiment (part 2).

Next, as illustrated in FIG. 5, the electric field relaxation region 15 and the shield region 19 are formed. For example, a mask layer (not illustrated) having an aperture corresponding to a region where the electric field relaxation region 15 and the shield region 19 are to be formed, is formed. Next, p-type impurity ions that can impart p type, such as aluminum ions or the like, are implanted into the epitaxial layer 21. Thereby, the electric field relaxation region 15 and the shield region 19 are formed. The mask layer is removed after formation of the electric field relaxation region 15 and the shield region 19.

Next, as illustrated in FIG. 5, the buried JTE region 17 is formed. For example, a mask layer (not illustrated) having an aperture corresponding to a region where the buried JTE region 17 is to be formed, is formed. Next, p-type impurity ions that can impart p type, such as aluminum ions or the like, are implanted into the epitaxial layer 21. Thereby, the buried JTE region 17 is formed. The mask layer is removed after formation of the buried JTE region 17.

Figure 6:
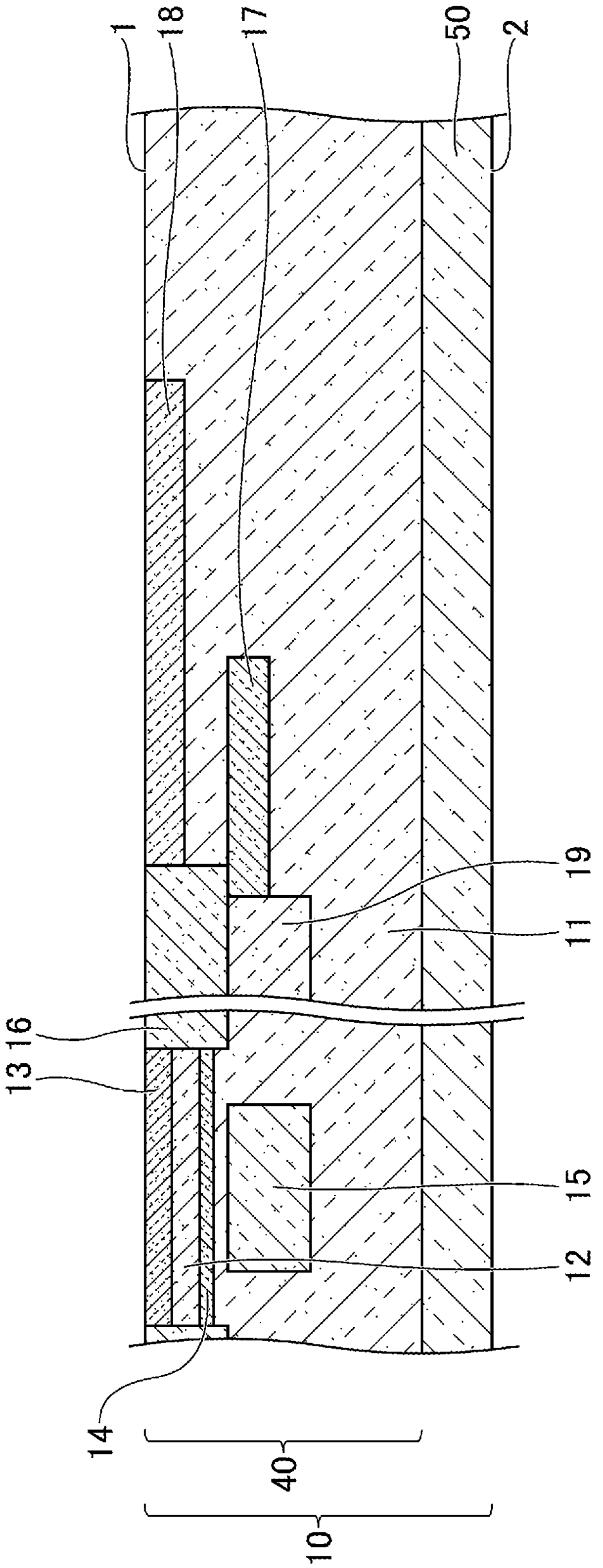
FIG. 6 is a cross-sectional view illustrating the production method of the silicon carbide semiconductor device according to the embodiment (part 3).

Next, as illustrated in FIG. 6, the body region 12 is formed. For example, a mask layer (not illustrated) having an aperture corresponding to a region where the body region 12 is to be formed, is formed. Next, p-type impurity ions that can impart p type, such as aluminum ions or the like, are implanted into the epitaxial layer 21. Thereby, the body region 12 is formed.

Next, as illustrated in FIG. 6, the current diffusion region 14 is formed. For example, n-type impurity ions that can impart n type, such as phosphorus ions or the like, are implanted into the epitaxial layer 21. Thereby the current diffusion region 14 is formed.

Next, as illustrated in FIG. 6, the source region 13 is formed. For example, n-type impurity ions that can impart n type, such as phosphorus ions or the like, are implanted into the epitaxial layer 21. Thereby, the source region 13 is formed. The mask layer is removed after formation of the source region 13.

Next, as illustrated in FIG. 6, the contact region 16 is formed. For example, a mask layer (not illustrated) having an aperture corresponding to a region where the contact region 16 is to be formed, is formed. Next, p-type impurities that can impart p type, such as aluminum ions or the like, are implanted into the epitaxial layer 21. Thereby, the contact region 16 is formed.

Next, as illustrated in FIG. 6, the surface JTE region 18 is formed. For example, a mask layer (not illustrated) having an aperture corresponding to a region where the surface JTE region 18 is to be formed, is formed. Next, p-type impurities that can impart p type, such as aluminum ions or the like, are implanted into the epitaxial layer 21. Thereby, the surface JTE region 18 is formed.

Next, activation annealing is performed for activating the impurity ions implanted into the silicon carbide substrate 10. The temperature of the activation annealing is preferably 1500° C. or higher and 1900° C. or lower and is, for example, about 1700° C. The duration of the activation annealing is, for example, about 30 minutes. The atmosphere in the activation annealing is preferably an inert gas atmosphere and is, for example, an argon (Ar) atmosphere.

Figure 7:
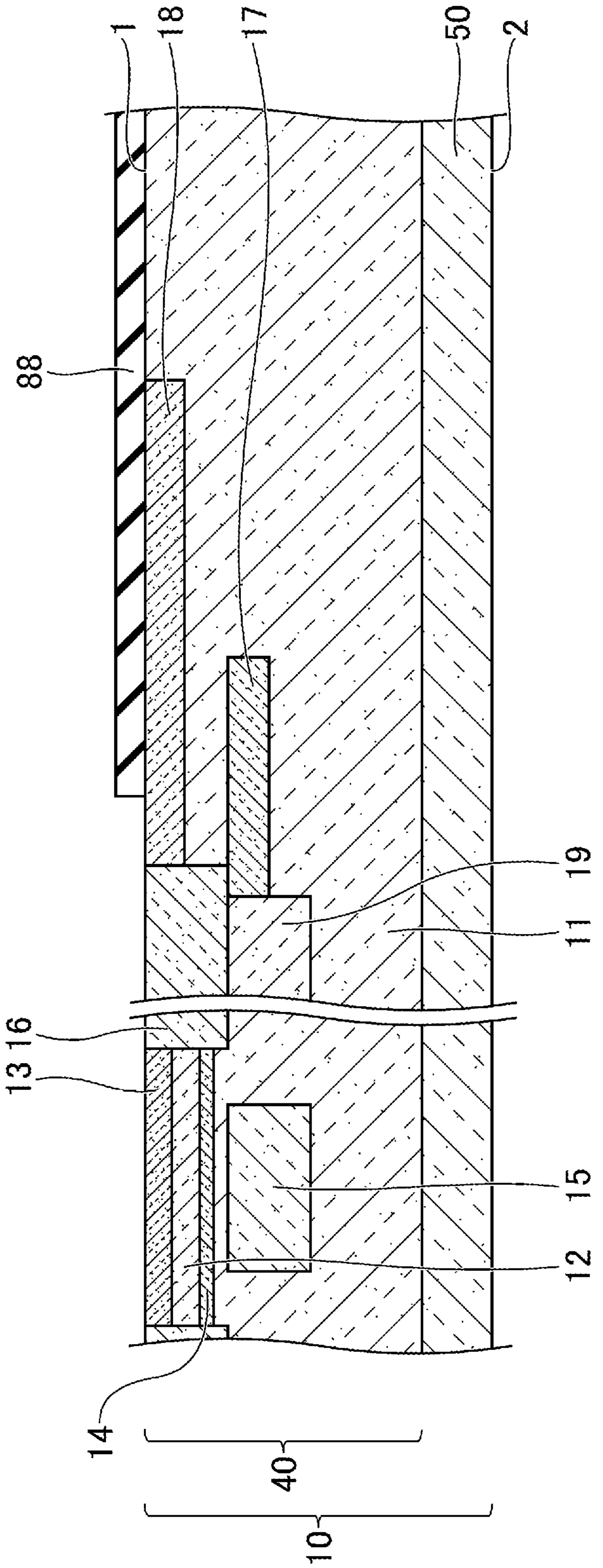
FIG. 7 is a cross-sectional view illustrating the production method of the silicon carbide semiconductor device according to the embodiment (part 4).

Next, as illustrated in FIG. 7, the field insulating film 88 overlapping the termination region 7 is formed. The thickness of the field insulating film 88 is, for example, 100 nm or larger and 500 nm or smaller. The field insulating film 88 is formed through CVD using, for example, a gas mixture of silane ($SiH_4$) and oxygen ($O_2$) or tetraethoxysilane (tetraethyl orthosilicate: TEOS).

Figure 8:
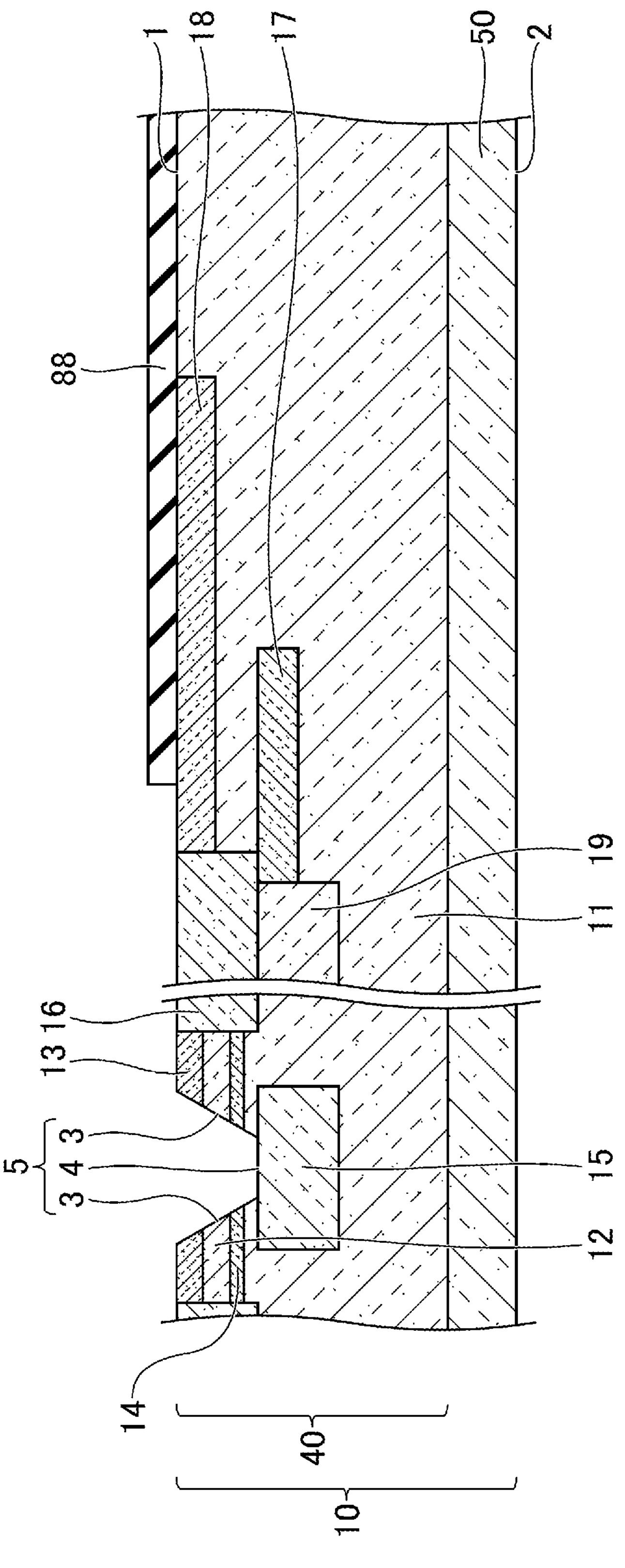
FIG. 8 is a cross-sectional view illustrating the production method of the silicon carbide semiconductor device according to the embodiment (part 5).

Next, as illustrated in FIG. 8, the gate trench 5 is formed. For example, a mask layer (not illustrated) having an aperture corresponding to a position where the gate trench 5 is to be formed, is formed on the first main surface 1. Using the mask layer, a part of the source region 13, a part of the body region 12, a part of the current diffusion region 14, and a part of the drift region 11 are removed through etching. As a method for etching, for example, reactive ion etching (RIE), especially inductively coupled plasma reactive ion etching can be used. Specifically, inductively coupled plasma reactive ion etching using, for example, sulfur hexafluoride ($SF_6$) or a gas mixture of $SF_6$ and oxygen ($O_2$) as a reactive gas can be used. Through etching, a recessed portion (not illustrated) is formed in a region where the gate trench 5 is to be formed. The recessed portion formed has a lateral portion approximately perpendicular to the first main surface 1, and a bottom portion that is provided to be continuous with the lateral portion and is approximately parallel to the first main surface 1.

Next, thermal etching is performed in the recessed portion. The thermal etching can be performed, for example, through heating in an atmosphere containing a reactive gas having at least one or more types of halogen atoms, with the mask layer being formed on the first main surface 1. The at least one or more types of halogen atoms include a chlorine (Cl) atom, a fluorine (F) atom, or both. The atmosphere includes chlorine ($Cl_2$), boron trichloride ($BCl_3$), $SF_6$, tetrafluoromethane ($CF_4$), or the like. For example, thermal etching is performed using a gas mixture of chlorine gas and oxygen gas as a reactive gas at a thermal treatment temperature of, for example, 800° C. or higher and 900° C. or lower. Note that, the reactive gas may include a carrier gas in addition to the above-described chlorine gas and oxygen gas. As the carrier gas, for example, nitrogen gas, argon gas, helium gas, or the like can be used.

Through the above thermal etching, the gate trench 5 is formed in the first main surface 1 of the silicon carbide substrate 10. The gate trench 5 is defined by the side surface 3 and the bottom surface 4. The side surface 3 is formed by the source region 13, the body region 12, the current diffusion region 14, and the drift region 11. The bottom surface 4 is formed by the electric field relaxation region 15. The angle θ1 between the side surface 3 and the flat surface including the bottom surface 4 is, for example, 45° or higher and 65° or lower. Next, the mask layer is removed from the first main surface 1.

Figure 9:
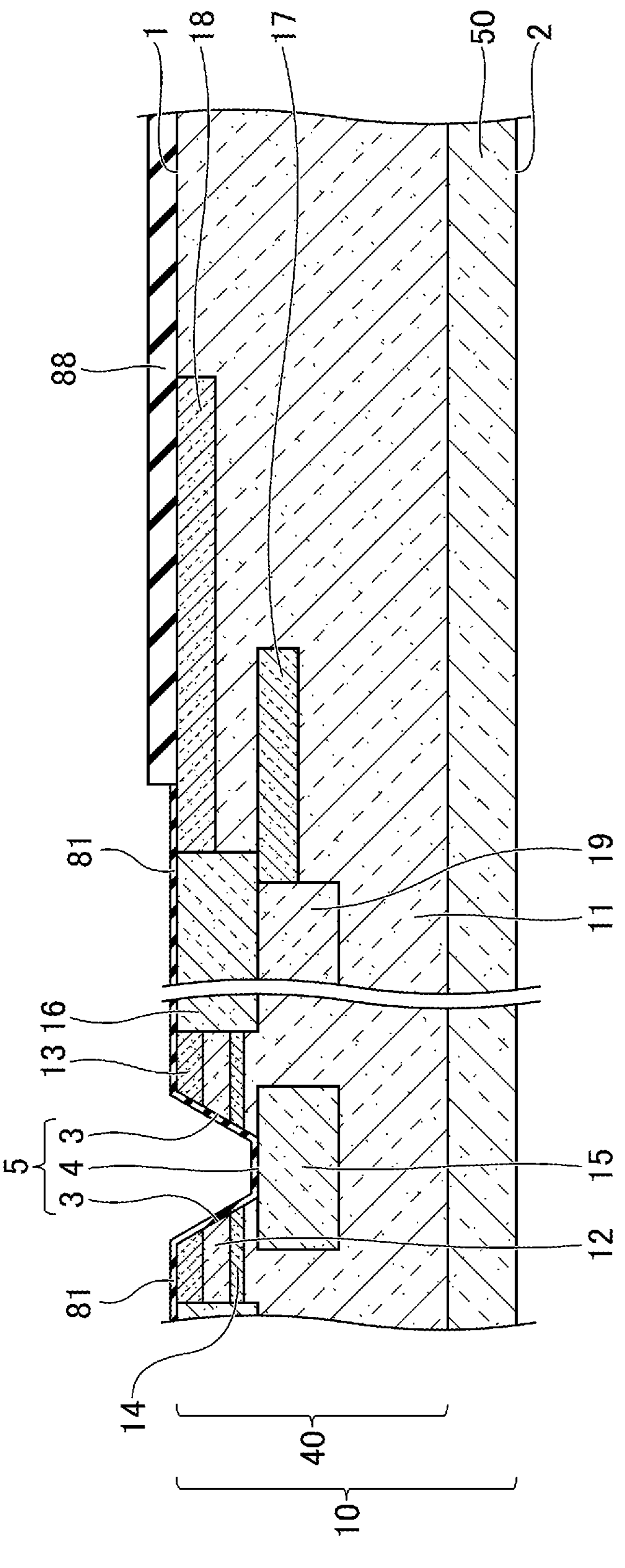
FIG. 9 is a cross-sectional view illustrating the production method of the silicon carbide semiconductor device according to the embodiment (part 6).

Next, as illustrated in FIG. 9, the gate insulating film 81 is formed. The gate insulating film 81 is thinner than the field insulating film 88. The thickness of the gate insulating film 81 is, for example, 50 nm or larger and 70 nm or smaller. For example, through thermal oxidation of the silicon carbide substrate 10, the gate insulating film 81 in contact with the source region 13, the body region 12, the current diffusion region 14, the drift region 11, the electric field relaxation region 15, and the contact region 16 is formed. Specifically, the silicon carbide substrate 10 is heated at, for example, a temperature of 1300° C. or higher and 1400° C. or lower in an atmosphere containing oxygen. Thereby, the gate insulating film 81 in contact with the first main surface 1, the side surface 3, and the bottom surface 4 is formed. Note that, when the gate insulating film 81 is formed through thermal oxidation, strictly speaking, a part of the silicon carbide substrate 10 is taken into the gate insulating film 81. Therefore, in the subsequent process, the first main surface 1, the side surface 3, and the bottom surface 4 are assumed to be slightly moved to the interface between the gate insulating film 81 and the silicon carbide substrate 10 after the thermal oxidation.

Next, in a nitrogen monoxide (NO) gas atmosphere, a thermal treatment (NO annealing) may be performed to the silicon carbide substrate 10. In the NO annealing, the silicon carbide substrate 10 is maintained, for example, for about one hour at 1100° C. or higher and 1400° C. or lower. Thereby, a nitrogen atom is introduced to an interface region between the gate insulating film 81 and the body region 12. As a result, formation of an interface state in the interface region is suppressed, and thereby channel mobility can be increased.

After the NO annealing, Ar annealing using argon (Ar) as an atmospheric gas may be performed. The heating temperature in the Ar annealing is, for example, equal to or higher than the heating temperature in the NO annealing. The duration of the Ar annealing is, for example, about one hour. Thereby, the formation of the interface state in the interface region between the gate insulating film 81 and the body region 12 is further suppressed. Note that, as the atmospheric gas, other inert gases such as nitrogen gas may be used instead of the Ar gas.

Figure 10:
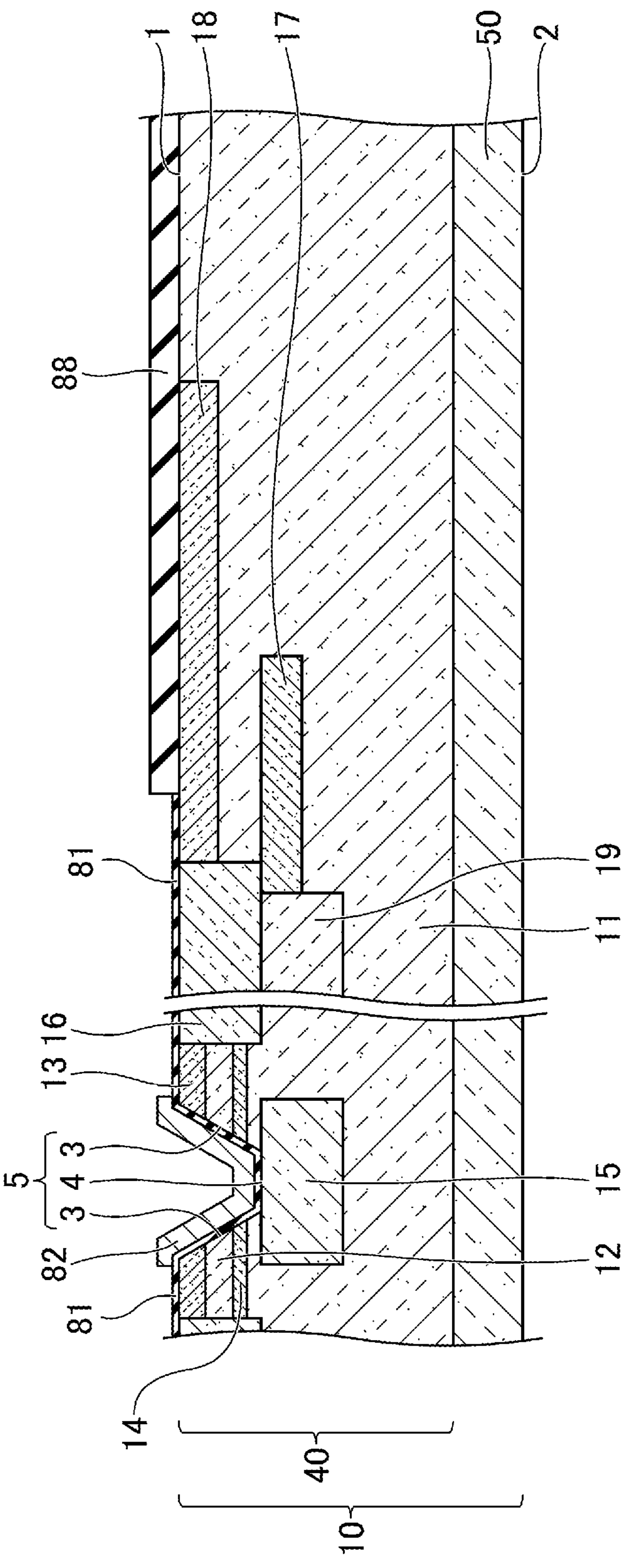
FIG. 10 is a cross-sectional view illustrating the production method of the silicon carbide semiconductor device according to the embodiment (part 7).

Next, as illustrated in FIG. 10, the gate electrode 82 is formed. The gate electrode 82 is formed on the gate insulating film 81. The gate electrode 82 is formed, for example, through low pressure-chemical vapor deposition (LP-CVD). The gate electrode 82 is formed so as to face the source region 13, the body region 12, the current diffusion region 14, and the drift region 11.

Figure 11:
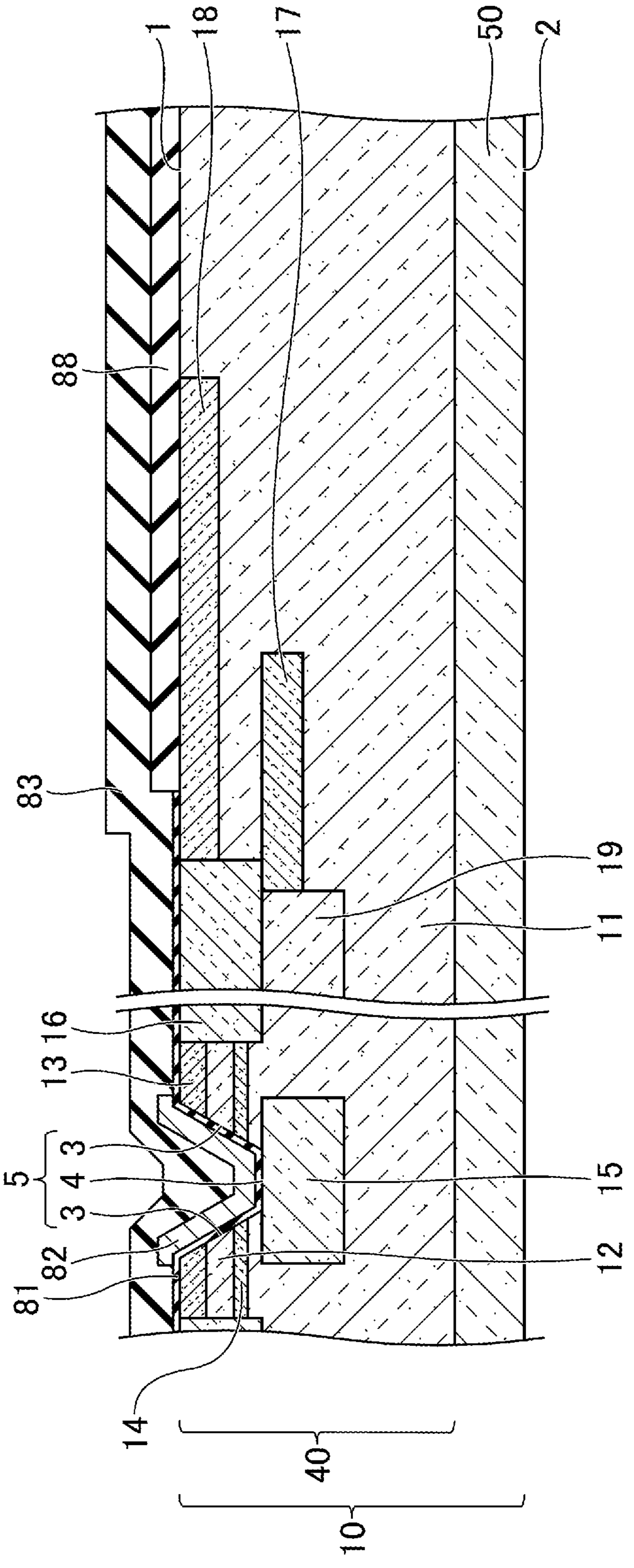
FIG. 11 is a cross-sectional view illustrating the production method of the silicon carbide semiconductor device according to the embodiment (part 8).

Next, as illustrated in FIG. 11, the interlayer insulating film 83 is formed. The thickness of the interlayer insulating film 83 is, for example, 300 nm or larger and 1000 nm or smaller. Specifically, the interlayer insulating film 83 is formed so as to cover the gate electrode 82 and contact the gate insulating film 81. The interlayer insulating film 83 is formed, for example, through CVD. The interlayer insulating film 83 is formed of, for example, a material containing silicon dioxide. A part of the interlayer insulating film 83 may be formed in the interior of the gate trench 5.

Figure 12:
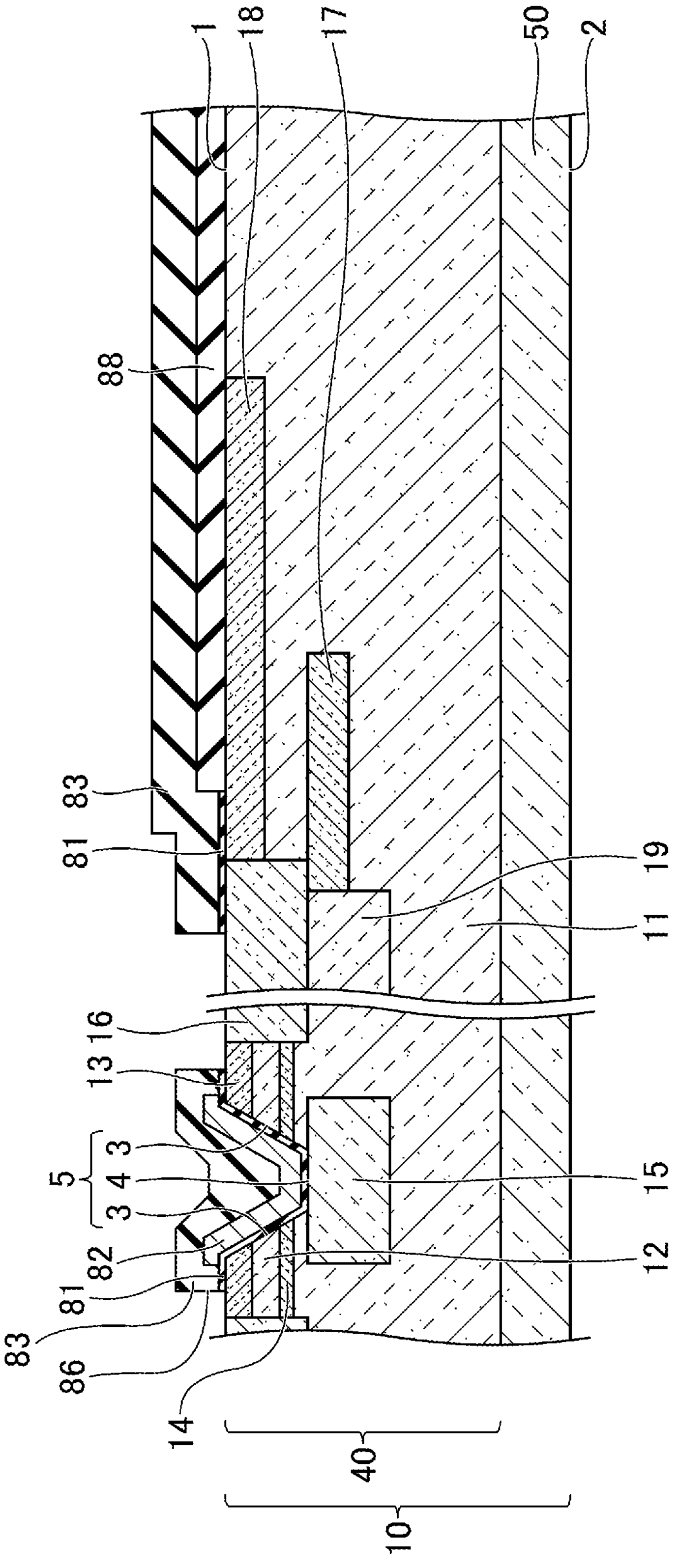
FIG. 12 is a cross-sectional view illustrating the production method of the silicon carbide semiconductor device according to the embodiment (part 9).

Next, as illustrated in FIG. 12, the contact hole 86 is formed in the interlayer insulating film 83 and the gate insulating film 81. The contact region 16 is exposed in the contact hole 86 from the interlayer insulating film 83 and the gate insulating film 81.

Figure 13:
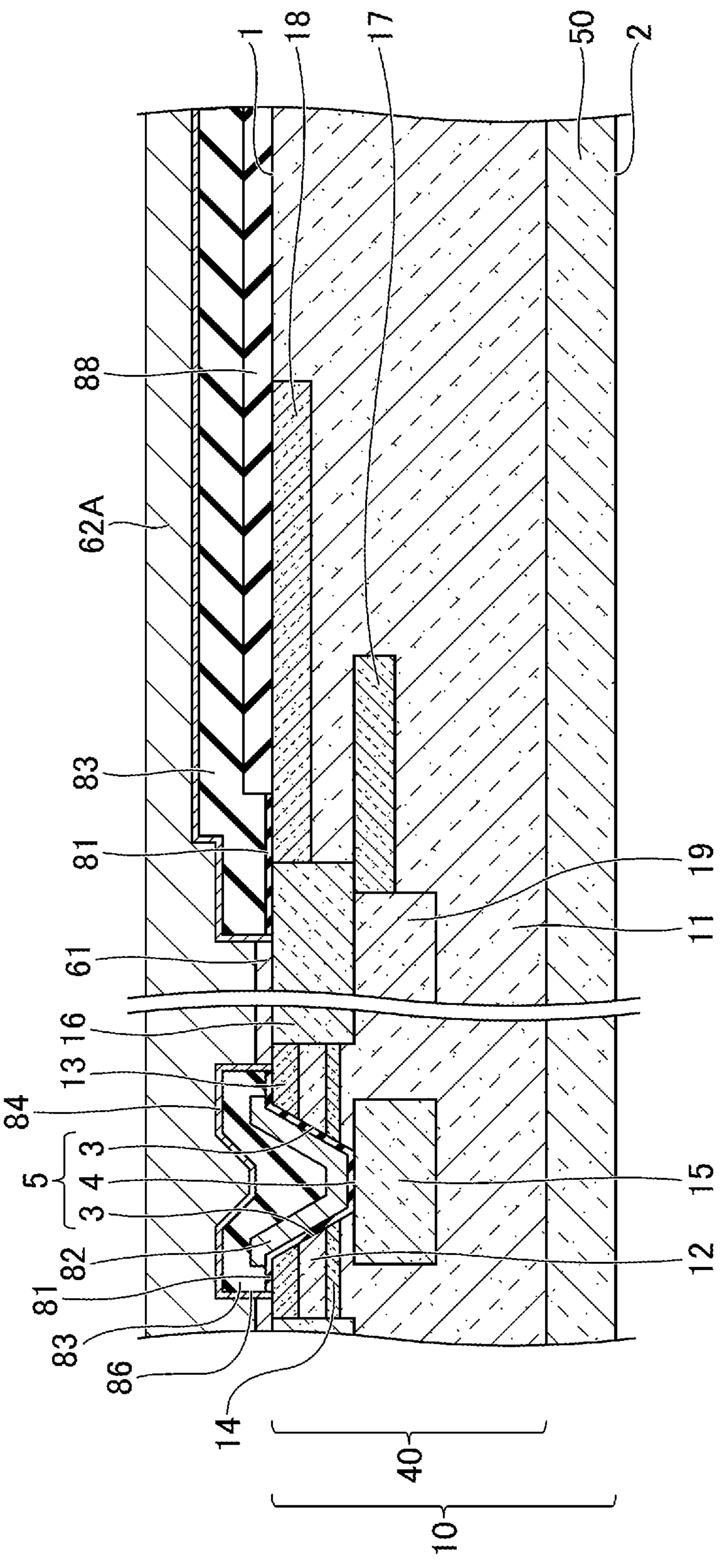
FIG. 13 is a cross-sectional view illustrating the production method of the silicon carbide semiconductor device according to the embodiment (part 10).

Next, as illustrated in FIG. 13, the barrier metal film 84 and the contact electrode 61 are formed. For example, the barrier metal film 84 covering the upper surface and the side surface of the interlayer insulating film 83 and the side surface of the gate insulating film 81 is formed. The barrier metal film 84 is formed of, for example, a material containing titanium nitride. The barrier metal film 84 is formed, for example, through film formation by sputtering and RIE. Next, a metal film (not illustrated) for the contact electrode 61 to contact the contact region 16 in the first main surface 1 is formed. The metal film for the contact electrode 61 is formed, for example, through sputtering. The metal film for the contact electrode 61 is formed of, for example, a material containing nickel. Next, alloying annealing is performed. The metal film for the contact electrode 61 is, for example, maintained for about five minutes at a temperature of 900° C. or higher and 1100° C. or lower. Thereby, at least a part of the metal film for the contact electrode 61 is silicided through reaction with silicon contained in the silicon carbide substrate 10, thereby forming the contact electrode 61 in Ohmic contact with the contact region 16. The thickness of the contact electrode 61 is, for example, 10 nm or larger and 100 nm or smaller.

Next, as illustrated in FIG. 13, a metal film 62A for the source pad electrode 62 is formed. Specifically, the metal film 62A covering the contact electrode 61 and the barrier metal film 84 is formed. The thickness of the metal film 62A is, for example, 3000 nm or larger and 5000 nm or smaller. The metal film 62A is formed, for example, through sputtering. The metal film 62A is formed of, for example, a material containing aluminum.

Figure 14:
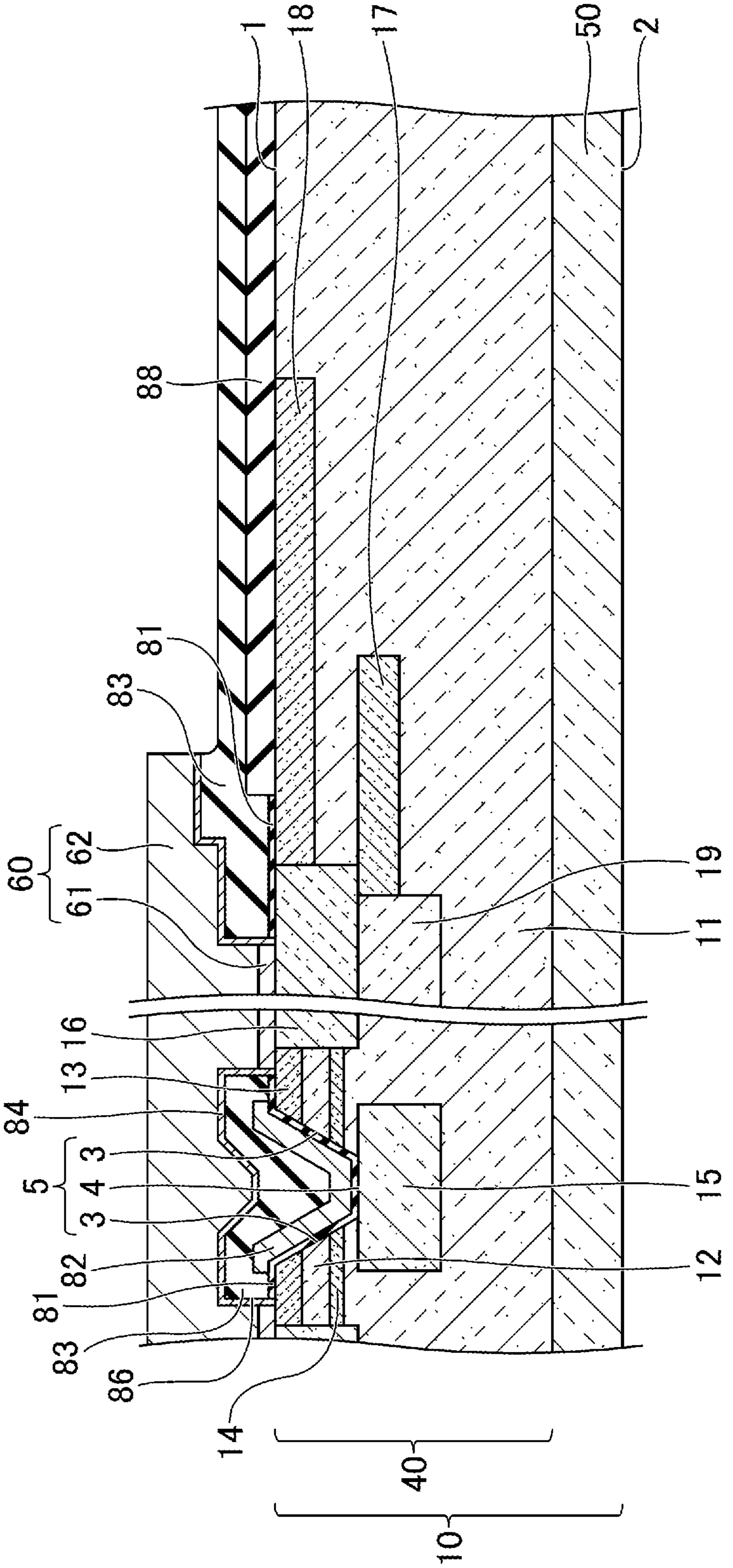
FIG. 14 is a cross-sectional view illustrating the production method of the silicon carbide semiconductor device according to the embodiment (part 11).

Next, as illustrated in FIG. 14, the source pad electrode 62 is formed from the metal film 62A. For example, a mask layer (not illustrated) covering a region where the source pad electrode 62 is to be formed, is formed on the metal film 62A. Using the mask layer, a part of the metal film 62A is removed through etching. As a method for etching, for example, RIE can be used. Upon etching the metal film 62A, over-etching of the interlayer insulating film 83 is performed. For example, the interlayer insulating film 83 is etched to have a thickness of about 400 nm. In this way, the source electrode 60 including the contact electrode 61 and the source pad electrode 62 is formed. Also, the insulating layer 30 including the gate insulating film 81, the field insulating film 88, and the interlayer insulating film 83 is formed. The curved surface 93 is formed on the surface of the interlayer insulating film 83 (see FIG. 3). Next, the mask layer is removed from the source pad electrode 62.

Figure 15:
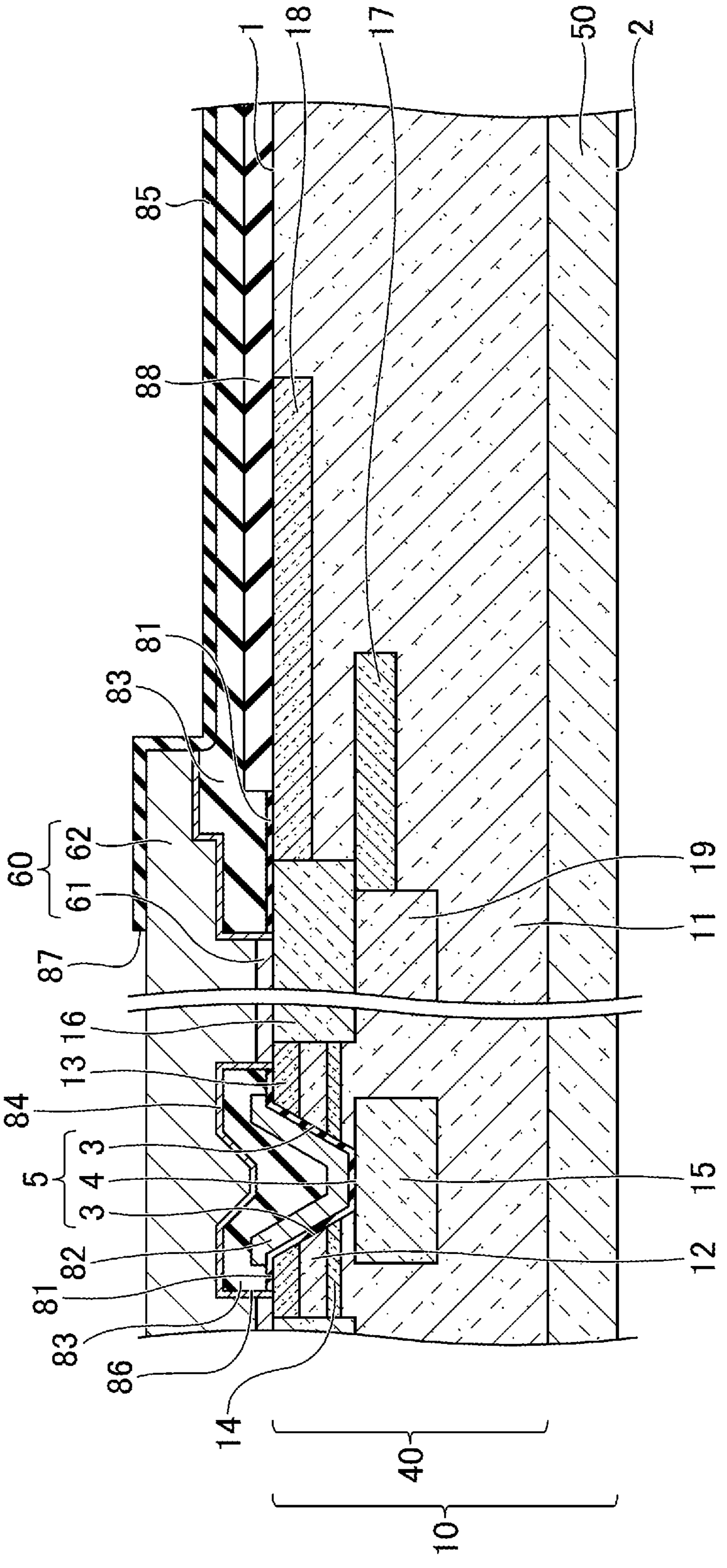
FIG. 15 is a cross-sectional view illustrating the production method of the silicon carbide semiconductor device according to the embodiment (part 12).

Next, as illustrated in FIG. 15, the passivation film 85 is formed. The thickness of the passivation film 85 is, for example, 100 nm or larger and 800 nm or smaller. Specifically, the passivation film 85 covering the source pad electrode 62 is formed. The passivation film 85 is formed of, for example, a material containing silicon nitride or polyimide. Next, the opening 87 is formed in the passivation film 85.

Figure 16:
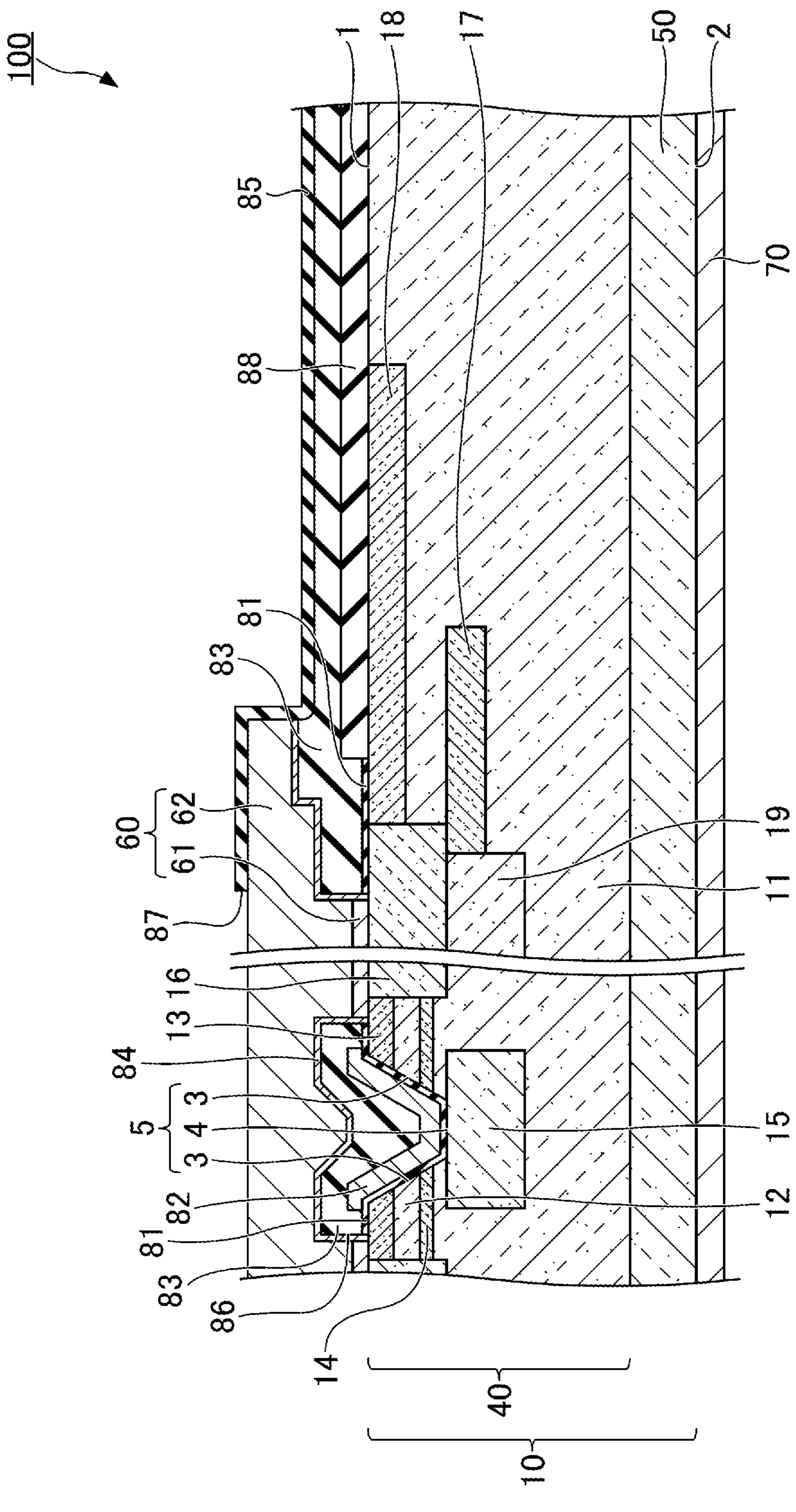
FIG. 16 is a cross-sectional view illustrating the production method of the silicon carbide semiconductor device according to the embodiment (part 13).

Next, as illustrated in FIG. 16, the drain electrode 70 is formed. For example, a metal film (not illustrated) for the drain electrode 70 to contact the silicon carbide single-crystal substrate 50 in the second main surface 2 is formed. The metal film for the drain electrode 70 is formed, for example, through sputtering. The metal film for the drain electrode 70 is formed of, for example, a material containing nickel. Next, alloying annealing is performed. The metal film for the drain electrode 70 is, for example, maintained for about five minutes at a temperature of 900° C. or higher and 1100° C. or lower. Thereby, at least a part of the metal film for the drain electrode 70 is silicided through reaction with silicon contained in the silicon carbide substrate 10, thereby forming the drain electrode 70 in Ohmic contact with the silicon carbide single-crystal substrate 50. The alloying annealing between the formation of the metal film for the contact electrode 61 and the formation of the metal film 62A for the source pad electrode 62 may be omitted, and the metal film for the contact electrode 61 may be silicided through annealing after the formation of the metal film for the drain electrode 70.

In this way, the MOSFET 100 according to the embodiment is completed.

Next, the actions and effects of the MOSFET according to the present embodiment will be described.

In the MOSFET 100 according to the present embodiment, over-etching of the interlayer insulating film 83 is performed upon forming the source pad electrode 62, and the second thickness T2 of the second portion 32 is larger than the first thickness T1 of the first portion 31. Therefore, it is possible to suppress generation of metal residues upon etching the metal film 62A. Thus, it is possible to relax electric field concentration of the insulating layer 30 originating from the metal residues in the termination region 7. Also, the second thickness T2 of the second portion 32 is larger than the third thickness T3 of the third portion 33. Thus, thickening of the insulating layer 30 in the active region 6 is suppressed, and the contact hole 86 is readily embedded with the source pad electrode 62.

Also, because the insulating layer 30 includes the curved surface 93 connecting the upper surface 91 and the side surface 92 to each other, stress concentration in the insulating layer 30 is readily suppressed compared to the case in which the upper surface 91 and the side surface 92 directly connect to each other. Moreover, stress concentration in the passivation film 85 formed on the insulating layer 30 is also readily suppressed.

Also, $0.1 \le r/T1 \le 0.5$ is preferably established, where r denotes a radius of an imaginary circle 94 including the curved surface 93 in the cross section perpendicular to the first main surface 1. When the value of r/T1 is less than 0.1, there is a risk that the effect of suppressing stress concentration cannot be obtained well. Meanwhile, when the value of r/T1 is more than 0.5, the first thickness T1 of the first portion 31 is especially thin with respect to the second thickness T2 of the second portion 32, and there is a risk that electric field concentration tends to occur in the termination region 7 in an OFF state. That is, when $0.1 \le r/T1 \le 0.5$ is established, both of relaxation of stress concentration and relaxation of electric field concentration in the termination region 7 can be readily achieved.

The first thickness T1 is preferably larger than the third thickness T3. When the first thickness T1 is larger than the third thickness T3, the contact hole 86 can be readily embedded with the source pad electrode 62 while relaxing electric field concentration in the termination region 7. Also, the third thickness T3 may be larger than the first thickness T1. When electric field concentration does not tend to occur in the first portion 31 in accordance with applications and the like, the first thickness T1 may be smaller than the third thickness T3.

In the plan view from the direction perpendicular to the first main surface 1, the source electrode 60 may overlap a part of the termination region 7. In this case, the source electrode 60 is readily broadly ensured.

In the present embodiment, the gate insulating film 81, the field insulating film 88, and the interlayer insulating film 83 included in the insulating layer 30 contain silicon oxide. Thus, film formation and processing are readily performed, and good insulating properties are obtained.

In the present embodiment, the first main surface 1 in the active region 6 and the first main surface 1 in the termination region 7 are flush with each other. Because the insulating layer 30 is appropriately formed, good characteristics are obtained even without forming a recessed portion in the silicon carbide substrate 10.

Also, the active region 6 is protected by the passivation film 85. Especially, when the curved surface 93 is formed, stress applied to the passivation film 85 is readily relaxed even if the passivation film 85 includes silicon nitride.

While embodiments have been described above in detail, the present invention is not limited to the specific embodiments, and various modifications and alterations are possible in the scope of claims as recited.

REFERENCE SIGNS LIST

1 first main surface
2 second main surface
3 side surface
4 bottom surface
5 gate trench
6 active region
7 termination region

10 silicon carbide substrate
11 drift region
12 body region
13 source region
14 current diffusion region
15 electric field relaxation region
16 contact region
17 buried JTE region
18 surface JTE region
19 shield region
21 epitaxial layer
30 insulating layer
31 first portion
32 second portion
33 third portion
40 silicon carbide epitaxial layer
50 silicon carbide single-crystal substrate
60 source electrode
61 contact electrode
62 source pad electrode
62A metal film
70 drain electrode
81 gate insulating film
82 gate electrode
83 interlayer insulating film
84 barrier metal film
85 passivation film
86 contact hole
87 opening
88 field insulating film
91 upper surface
92 side surface
93 curved surface
94 imaginary circle

The invention claimed is:

1. A silicon carbide semiconductor device comprising:

a silicon carbide substrate including a first main surface and a second main surface opposite to the first main surface; and an insulating layer in contact with the first main surface, wherein in a plan view from a direction perpendicular to the first main surface, the silicon carbide substrate includes an active region and a termination region that encloses the active region, an opening in which a part of the active region is exposed is formed in the insulating layer, the silicon carbide semiconductor device further includes an electrode that is formed on the insulating layer and is in contact with the first main surface through the opening, the insulating layer includes:

a first portion overlapping the termination region in the plan view and having a first thickness;

a second portion connecting to the first portion, overlapping the electrode in the plan view, and having a second thickness; and a third portion connecting to the second portion, overlapping the electrode in the plan view, and having a third thickness, the opening is formed in the third portion, the second portion is between the first portion and the third portion, the second thickness is larger than the first thickness and the third thickness, and the first main surface of the silicon carbide substrate is planar across the first portion, the second portion, and the third portion.

2. The silicon carbide semiconductor device according to claim 1, wherein the insulating layer includes:

an upper surface of the first portion that is parallel to the first main surface;

a side surface of the second portion that is exposed toward the first portion and is perpendicular to the first main surface; and a curved surface connecting the upper surface and the side surface to each other, and the curved surface has a curvature that is convex with respect to a direction toward the insulating layer.

3. The silicon carbide semiconductor device according to claim 2, wherein $0.1 \leq r/T1 \leq 0.5$ is established, where r denotes a radius of an imaginary circle including the curved surface in a cross section perpendicular to the first main surface, and T1 denotes the first thickness.

4. The silicon carbide semiconductor device according to claim 1, wherein the first thickness is larger than the third thickness.

5. The silicon carbide semiconductor device according to claim 1, wherein the third thickness is larger than the first thickness.

6. The silicon carbide semiconductor device according to claim 1, wherein the electrode overlaps a part of the termination region in the plan view.

7. The silicon carbide semiconductor device according to claim 1, wherein the insulating layer includes silicon oxide.

8. The silicon carbide semiconductor device according to claim 1, wherein the first main surface in the active region and the first main surface in the termination region are flush with each other.

9. The silicon carbide semiconductor device according to claim 1, further comprising:

a passivation film that covers the insulating layer and the electrode.

10. The silicon carbide semiconductor device according to claim 9, wherein the passivation film includes silicon nitride.

11. A production method of a silicon carbide semiconductor device, the production method comprising:

forming an insulating layer in contact with a first main surface of a silicon carbide substrate including the first main surface and a second main surface opposite to the first main surface, where in a plan view from a direction perpendicular to the first main surface, the silicon carbide substrate includes an active region and a termination region that encloses the active region, the forming the insulating layer including:

forming a field insulating film at the first main surface, the field insulating film overlapping the termination region in the plan view;

forming a gate insulating film at the first main surface, the gate insulating film overlapping the termination region in the plan view and being thinner than the field insulating film;

forming an interlayer insulating film covering the field insulating film and the gate insulating film;

forming an opening in the interlayer insulating film and the gate insulating film, the opening exposing a part of the active region;

forming a metal film on the interlayer insulating film, the metal film being in contact with the first main surface through the opening; and forming an electrode by etching the metal film while over-etching the interlayer insulating film.

* * * * *